(12) United States Patent
Shin et al.

(10) Patent No.: US 10,667,411 B2
(45) Date of Patent: May 26, 2020

(54) MULTI-PANEL DISPLAY DEVICE

(71) Applicant: LG DISPLAY CO., LTD., Seoul (KR)

(72) Inventors: Hee-Jong Shin, Paju-si (KR);
Han-Seok Kim, Paju-si (KR);
Sung-Hwan Yoon, Paju-si (KR)

(73) Assignee: LG DISPLAY CO., LTD, Seoul (KR)

( * ) Notice: Subject to any disclaimer, the term of this patent is extended or adjusted under 35 U.S.C. 154(b) by 0 days.

(21) Appl. No.: 16/197,325

(22) Filed: Nov. 20, 2018

(65) Prior Publication Data

US 2019/0166704 A1    May 30, 2019

(30) Foreign Application Priority Data

Nov. 28, 2017 (KR) .................. 10-2017-0160424

(51) Int. Cl.
| | |
|---|---|
| *H05K 5/00* | (2006.01) |
| *H01L 25/075* | (2006.01) |
| *H05K 5/02* | (2006.01) |
| *H01L 25/13* | (2006.01) |
| *G02F 1/1333* | (2006.01) |

(52) U.S. Cl.
CPC ......... *H05K 5/0021* (2013.01); *G02F 1/1333* (2013.01); *G02F 1/13336* (2013.01); *G02F 1/133308* (2013.01); *H01L 25/0753* (2013.01); *H01L 25/13* (2013.01); *H05K 5/0017* (2013.01); *H05K 5/0217* (2013.01); *H05K 5/0221* (2013.01); *G02F 2001/133314* (2013.01); *G02F 2001/133322* (2013.01)

(58) Field of Classification Search
CPC .. H05K 5/0021; H05K 5/0017; H05K 5/0217; H05K 5/0221; G02F 1/00; H01L 25/0753; H01L 25/13
See application file for complete search history.

(56) References Cited

U.S. PATENT DOCUMENTS

2003/0217495 A1* 11/2003 Nagamine ................. G09F 9/00
                                                                    40/605
2008/0266206 A1* 10/2008 Nelson ....................... G09F 9/33
                                                                    345/1.3
2016/0210886 A1*  7/2016 Brashnyk ............... G09F 9/3026
(Continued)

FOREIGN PATENT DOCUMENTS

KR    10-2006-0072737 A     6/2006
KR    10-2011-0025011 A     3/2011

*Primary Examiner* — Hoa C Nguyen
*Assistant Examiner* — Keith DePew
(74) *Attorney, Agent, or Firm* — Polsinelli PC (57) ABSTRACT

A multi-panel display device includes: a first display device and a second display device each including a display panel, a back cover configured to cover a rear surface of the display panel, and a back cover housing configured to cover a rear surface of the back cover, a first cabinet on which the first and second display devices are supported and attached, and a fine adjustment device positioned on a rear surface of each of the first and second display devices exposed to a rear surface of the first cabinet, wherein the fine adjustment device is connected to the back cover of each of the first and second display devices and exposed to the outside through an adjustment device hole provided in the back cover housing, and positions of the back cover and the display panel are finely adjusted by the fine adjustment device.

19 Claims, 8 Drawing Sheets

(56) References Cited

U.S. PATENT DOCUMENTS

2016/0369980 A1* 12/2016 Lan ............................ G09F 9/33
2017/0105293 A1*  4/2017 Kim ...................... H05K 5/0017
2018/0124932 A1*  5/2018 Seo ....................... H01L 25/105

* cited by examiner

MULTI-PANEL DISPLAY DEVICE

CROSS-REFERENCE TO RELATED APPLICATION

This application claims the benefit under 35 U.S.C. § 119(a) of Korean Patent Application No. 2017-0160424, filed on Nov. 28, 2017, in the Korean Intellectual Property Office, which is incorporated herein by reference in its entirety.

BACKGROUND

Field of the Disclosure

The present disclosure relates to a display device, and more particularly, to a multi-panel display device including a fixing system in which a plurality of display devices is mountable and positions of the display devices are finely adjustable.

Description of the Background

As the advent of full-fledged information age, a display field has rapidly developed for processing and displaying mass information. In response to such changes, various display devices have been developed and brought into the spotlight.

Specific examples of the display device include liquid-crystal displays (LCDs), plasma display panels (PDPs), field-emission displays (FEDs), electroluminescent displays (ELDs), organic light emitting diodes (OLEDs), and the like. The display devices exhibit high performance in terms of thinness, being light weight, and having low power consumption, and are rapidly replacing the existing cathode ray tubes (CRTs).

Recently, a display device including micro LEDs (μ-LEDs) having a higher luminous efficiency has been actively studied. The display device including the μ-LEDs displays an image by disposing an ultra-small LED having a chip size of 5 μm to 100 μm on each of a plurality of pixels.

The display device including the μ-LED may satisfy requirements in various application fields due to its advantages of low power consumption, long service lifetime, low cost, high brightness, wide viewing angle, and long viewing distance, and thus is recognized as a display device with the highest growth potential and the rapidest development.

Meanwhile, in order to realize one image on a large screen (about 100 inches) like a video wall using a display device including μ-LEDs (hereinafter referred to as a μ-LED display device), research is being actively conducted on a tiled type multi-panel display device in which a plurality of display devices are combined.

However, in such a multi-panel display device, a plurality of display devices is connected to each other by a separate fixing mechanism to form a single multi-panel display device, and thus a process time is lengthened and a process efficiency is very low.

Further, as a process of connecting neighboring display devices to each other is performed by a manual operation of an operator, damage due to collision of the display devices can occur in a process of arranging the neighboring display devices. Also, as the neighboring display devices are not accurately arranged, a boundary region between the neighboring display devices may be visible.

The boundary region between the neighboring display devices that is visible in the multi-panel display device causes a problem of degrading the continuity of an image.

SUMMARY

The present disclosure relates to a multi-panel display device including a plurality of display devices.

In addition, the present disclosure relates to a multi-panel display device in which a position of each of display devices can be finely adjusted so as not to degrade the continuity of an image.

Also, the present disclosure relates to a multi-panel display device in which occurrence of damage due to collision of neighboring display devices is prevented.

Further, the present disclosure relates to a multi-panel display device in which the efficiency of a process of installing a multi-panel display device is improved.

According to an aspect of the present disclosure, a multi-panel display device includes: a first display device and a second display device each including a display panel, a back cover configured to cover a rear surface of the display panel, and a back cover housing configured to cover a rear surface of the back cover, a first cabinet on which the first and second display devices are supported and attached, and a fine adjustment device positioned on a rear surface of each of the first and second display devices exposed to a rear surface of the first cabinet, wherein the fine adjustment device is connected to the back cover of each of the first and second display devices and exposed to the outside through an adjustment device hole provided in the back cover housing, and positions of the back cover and the display panel are finely adjusted by the fine adjustment device.

According to another aspect of the present disclosure, a multi-panel display device includes: first and second display devices each including a display panel, a back cover covering a rear surface of the display panel and including a linear guide portion on a side surface thereof, and a back cover housing covering a rear surface of the back cover; and a first cabinet where the first and second display devices are supported and attached, wherein the linear guide portion comprises: a linear guide groove on a side surface of the back cover to be concave in a longitudinal direction; and a linear guide protrusion on the side surface of the back cover to be convex in the longitudinal direction, and wherein the linear guide groove of one of the first and second display devices and the linear guide protrusion of an other of the first and second display devices are forcibly inserted into each other.

Advantages and features of the disclosure will be set forth in part in the description which follows and in part will become apparent to those having ordinary skill in the art upon examination of the following or may be learned from practice of the disclosure. Other advantages and features of the aspects herein may be realized and attained by the structure particularly pointed out in the written description and claims hereof as well as the appended drawings.

It is to be understood that both the foregoing general description and the following detailed description are explanatory and are intended to provide further explanation of the aspects as claimed.

BRIEF DESCRIPTION OF THE DRAWINGS

The accompanying drawings, which are included to provide a further understanding of the disclosure, are incorporated in and constitute a part of this application, illustrate implementations of the disclosure and together with the description serve to explain the principles of aspects of the disclosure.

DETAILED DESCRIPTION

Hereinafter, aspects of the present disclosure will be described in detail with reference to the accompanying drawings.

Figure 1:
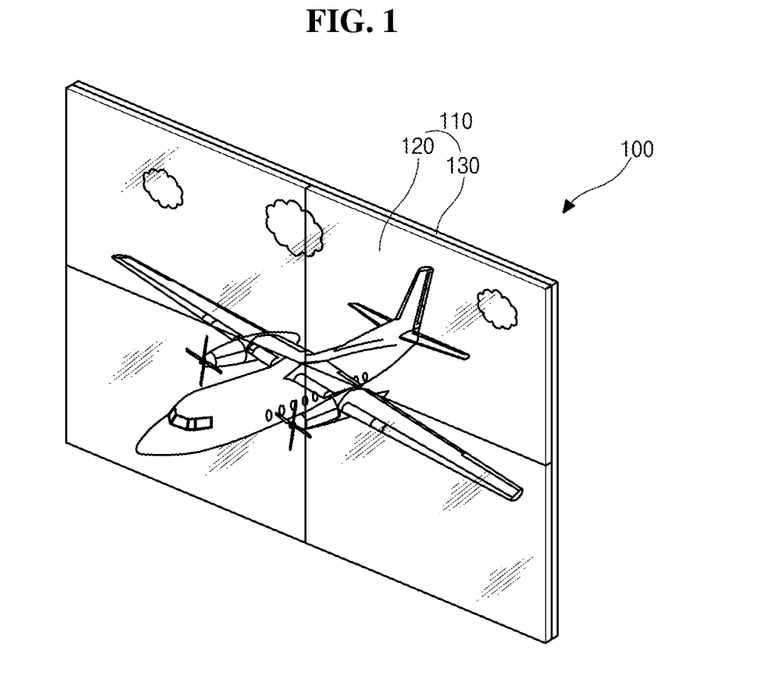
FIG. 1 is a perspective view schematically showing a multi-panel display device according to an aspect of the present disclosure.
Figure 2:
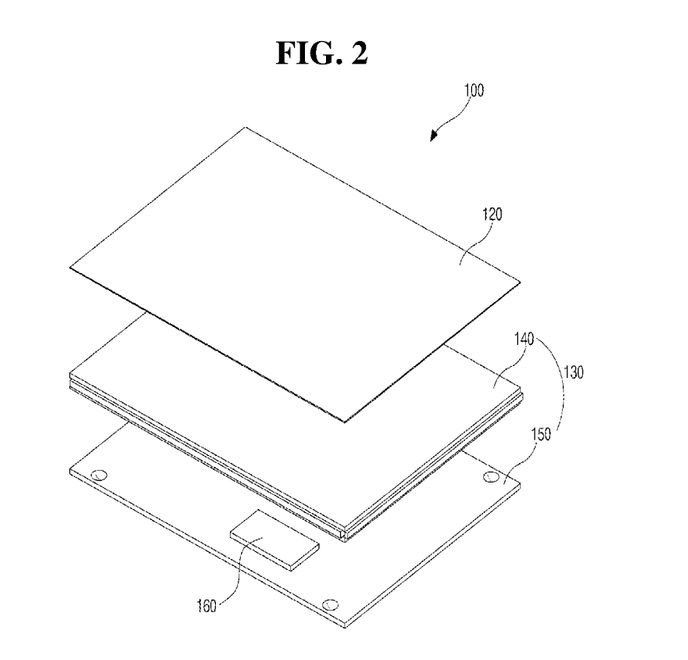
FIG. 2 is an exploded perspective view schematically showing a micro light-emitting diode (μ-LED) display device according to an aspect of the present disclosure.

FIG. 1 is a perspective view schematically showing a multi-panel display device according to an aspect of the present disclosure, and FIG. 2 is an exploded perspective view schematically showing a micro light-emitting diode (μ-LED) display device.

As shown in the drawings, a multi-panel display device 100 is formed by arranging a plurality of display devices 110 in a tiled form so that one image may be realized on a large screen of about 100 or more inches like a video wall or different images may be realized on the respective display devices 110.

In this case, each of the display devices 110 may include a display panel 120 for outputting an image signal supplied from the outside to a screen and a housing 130 for accommodating the display panel 120 and protecting the display panel 120 and circuit parts.

The display panel 120 may be formed as one of a liquid-crystal display (LCD), a plasma display panel (PDP), a field-emission display (FED), an electroluminescent display (ELD), an organic light-emitting diode (OLED), and a μ-LED display device. The μ-LED display device having advantages of low power consumption, miniaturization, light weight, and wide applicability may be used as the display panel 120.

The μ-LED display device displays an image by disposing an ultra-small LED having a chip size of 5 μm to 100 μm on each of a plurality of pixels.

In this case, a μ-LED, which is a light source, may be formed by using various materials on various substrates according to three primary colors of red, green, and blue. The μ-LED may be formed by using an inorganic material such as gallium nitride (GaN), gallium phosphide (GaP), and aluminum gallium arsenide (AlGaAs), or the like, on a gallium arsenide (GaAs) substrate, a sapphire substrate, or a silicon (Si) substrate depending on a light emission color.

The housing 130 is positioned below the display panel 120 formed as the μ-LED display device. The housing 130 includes an accommodating space for accommodating the display panel 120 and serves to protect the display panel 120 mounted on the housing 130, support the entire the display devices 110, and minimize occurrence of optical loss.

As described above, the housing 130 may be a component for dividing an outer side and an inner side of the display panel 120 and protecting parts mounted thereinside in a state in which the display panel 120 is accommodated, and may be configured as a single body, or may be divided into a plurality of bodies according to a design condition.

That is, the housing 130 includes a back cover 140 for supporting the display panel 120 and a back cover housing 150 positioned below the back cover 140. The back cover 140 is attached to a rear surface of the display panel 120 to support the display panel 120 because the display panel 120 is too thin.

The display panel 120 and the back cover 140 are attached to each other by a tackifier (not shown) or an adhesive (not shown).

The back cover housing 150 serves to protect a circuit element 160 positioned on a rear surface of the back cover 140 and at the same time, becomes the basis of the entire mechanical assembly of the display devices 110 formed as the μ-LED display device to secure overall rigidity.

Here, both of the back cover 140 and the back cover housing 150 may be made of any one of aluminum (Al), copper (Cu), zinc (Zn), silver (Ag), gold (Au), and iron (Fe) having high thermal conductivity, or an alloy of the above metals. The back cover 140 and the back cover housing 150 may be formed of aluminum (Al) having high thermal conductivity, low weight, and low cost characteristics.

Alternatively, the back cover 140 and the back cover housing 150 may be formed of electrolytic galvanized iron (EGI).

The back cover 140 and the back cover housing 150 are fixed to each other by a rubber magnet (not shown).

The circuit element 160 positioned between the back cover 140 and the back cover housing 150 may include a power supply unit for providing power required for driving the display panel 120, a driving board for converting an electrical signal provided from the outside into an image and sound, and the like.

In this case, in the multi-panel display device 100 according to the aspect of the present disclosure, the respective display devices 110 are attached to one cabinet 200a or 200b (of FIG. 3A or FIG. 3B) to form one unit U1 or U2 (of FIG. 4A), and thus one multi-panel display device 100 is formed, or a plurality of units U1 and U2 (of FIG. 4A) are gathered and thus one multi-panel display device 100 is formed.

Figure 4A:
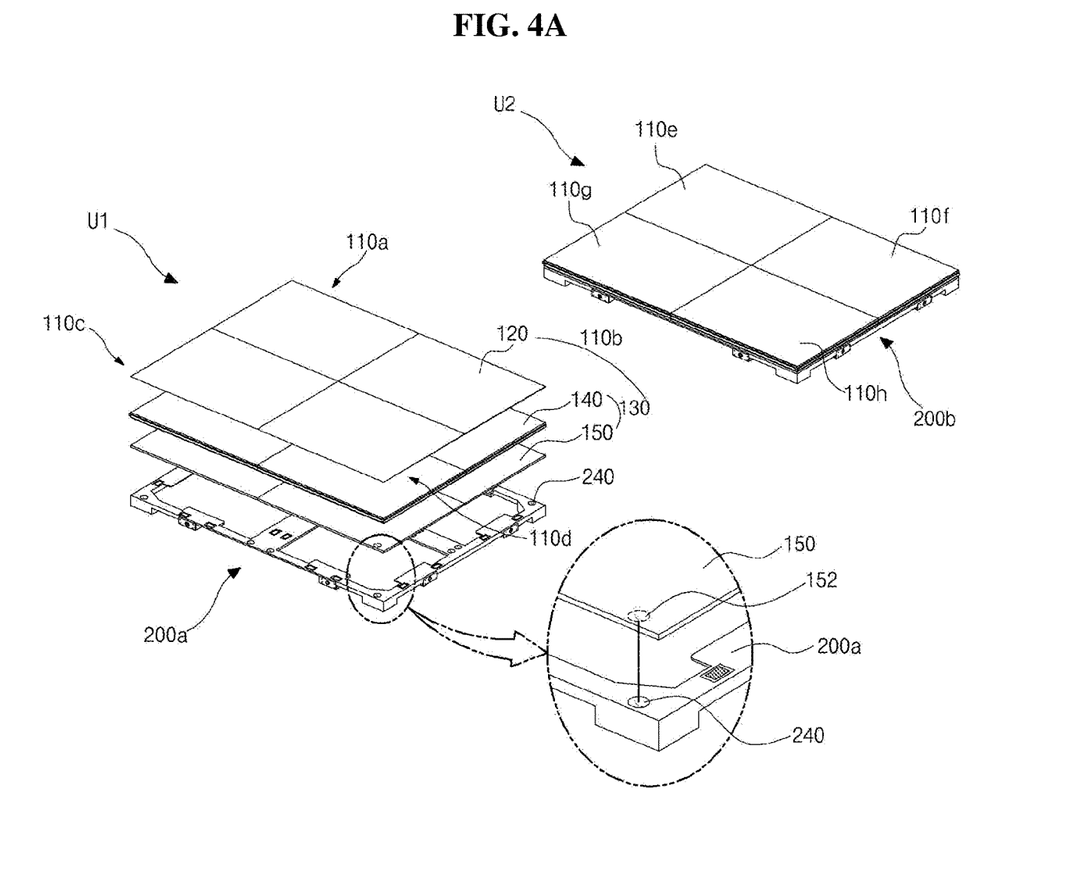
FIG. 4A is a perspective view schematically showing a state in which display devices are mounted on first and second cabinets according to an aspect of the present disclosure.

That is, first to fourth display devices 110a, 110b, 110c, and 110d (of FIG. 4A) are attached to a first cabinet 200a (of FIG. 4A) to form a first unit U1 (of FIG. 4A). The first to fourth display devices 110a, 110b, 110c, and 110d (of FIG. 4A) constitute one multi-panel display device 100, or a second unit U2 (of FIG. 4A) including a second cabinet 200b (of FIG. 4A), to which fifth to eighth display devices 110e, 110f, 110g, and 110h (of FIG. 4A) are attached, constitutes one multi-panel display device 100 together with the first unit U1 (of FIG. 4A).

In this case, the first and second cabinets 200a and 200b (of FIG. 4A) are assembled and fastened to each other so that the first and second units U1 and U2 (of FIG. 4A) constitute the multi-panel display device.

To this end, a plurality of magnet units 230 (of FIG. 3A) for fixing the plurality of display devices 110 are provided on the first and second cabinets 200a and 200b (of FIG. 4A) and a cam lever locker 400 (of FIG. 3B) is provided on a side surface of each of the first and second cabinets 200a and 200b. This will be described in more detail with reference to FIGS. 3A and 3B.

Figure 3A:
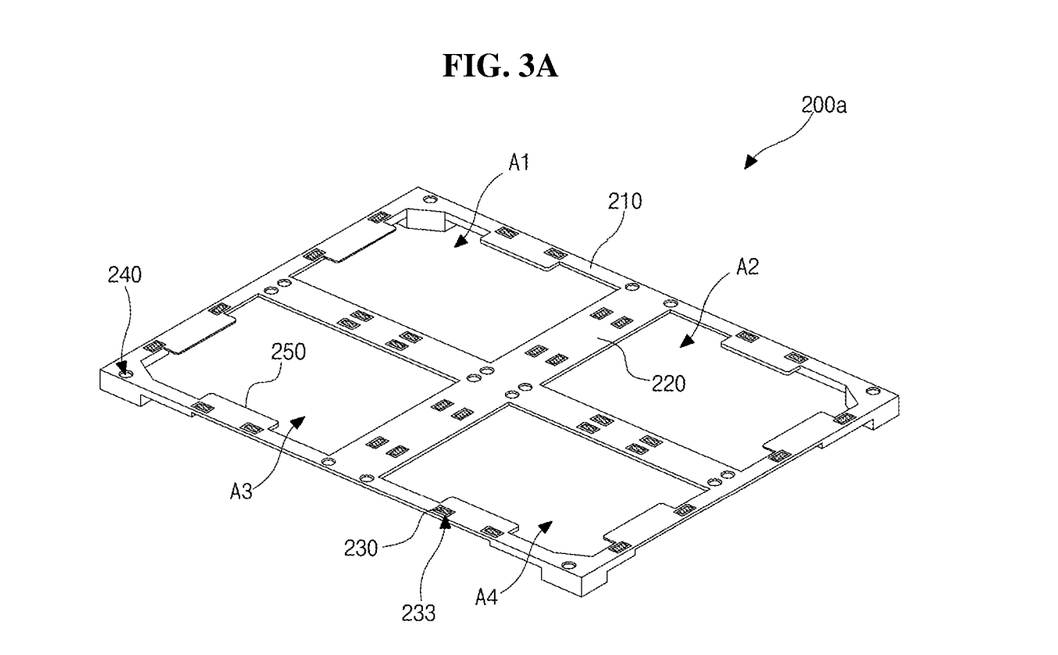
FIG. 3A is a perspective view schematically showing a cabinet of a multi-panel display device according to an aspect of the present disclosure.
Figure 3B:
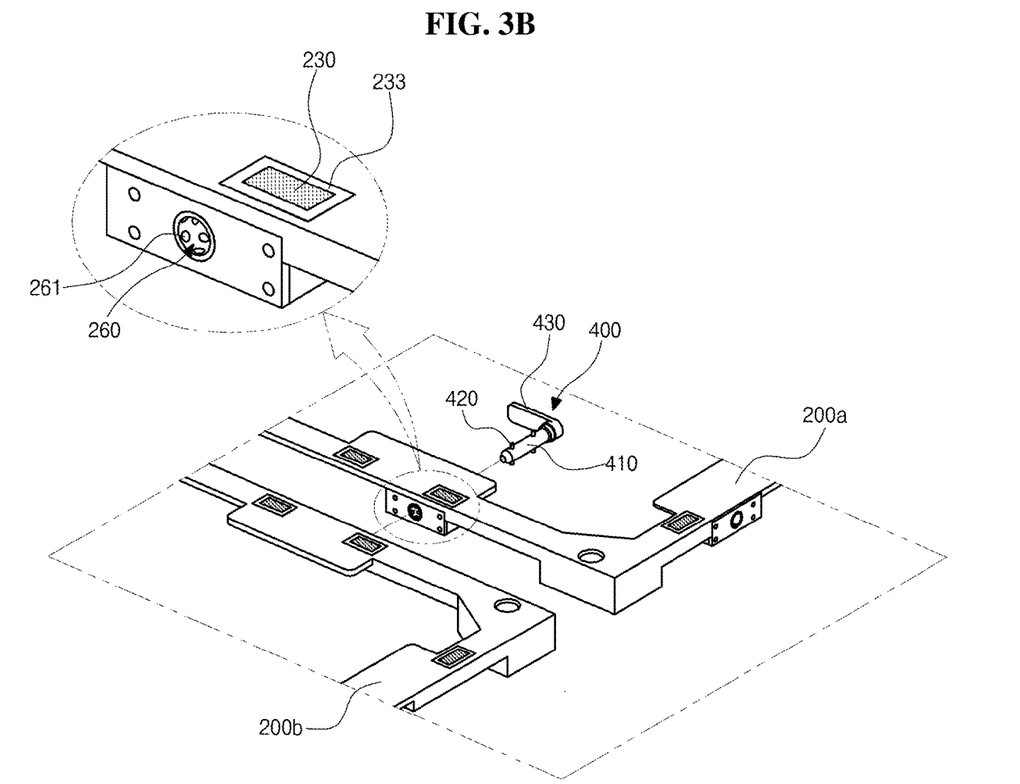
FIG. 3B is a perspective view schematically showing a state in which neighboring cabinets as shown in FIG. 3A are connected to each other by a cam lever locker.

FIG. 3A is a perspective view schematically showing the cabinet of the multi-panel display device according to the aspect of the present disclosure, and FIG. 3B is a perspective view schematically showing a state in which neighboring cabinets as shown in FIG. 3A are connected by the cam lever locker.

Figure 4B:
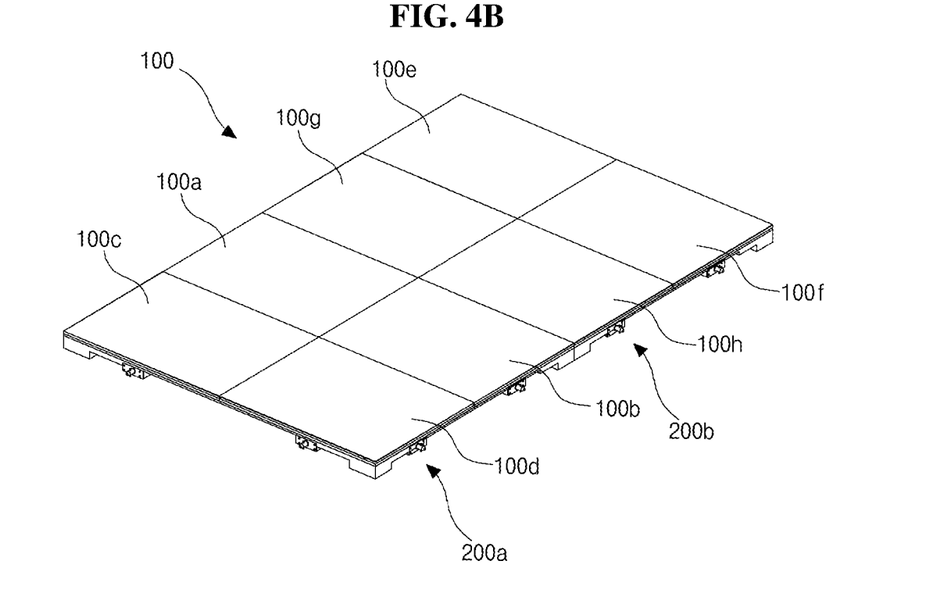
FIG. 4B is a perspective view schematically showing a multi-panel display device according to an aspect of the present disclosure.

FIG. 4A is a perspective view schematically showing a state in which the display devices are mounted on the first and second cabinets, and FIG. 4B is a perspective view schematically showing the multi-panel display device.

As shown in FIG. 3A, the first cabinet 200a includes a main frame 210, having a rectangular frame shape, and an auxiliary frame 220 which connects four inward edges of the main frame 210. The first cabinet 200a is divided with respect to a central portion of the auxiliary frame 220 to define four display device mounting portions A1, A2, A3, and A4.

Therefore, rear edges of the back cover housing 150 are mounted and supported on the main frame 210 and the auxiliary frame 220 so that the first to fourth display devices 110a, 110b, 110c, and 110d are fixed to the display device mounting portions A1, A2, A3, and A4 of the first cabinet 200a, respectively.

In this case, a plurality of magnet units 230 are provided on the main frame 210 and the auxiliary frame 220 along edges of the display device mounting portions A1, A2, A3, and A4 at regular intervals.

At least two magnet units 230 may be provided in a longitudinal direction of each of the display device mounting portions A1, A2, A3, and A4. A mounting groove 233 on which the magnet unit 230 is mounted may be provided in the main frame 210 and the auxiliary frame 220.

Due to the mounting grooves 233, the magnet units 230 provided on the main frame 210 and the auxiliary frame 220 do not protrude from upper portions of the main frame 210 and the auxiliary frame 220.

In addition, a plurality of guide grooves 240 are provided in the main frame 210 and the auxiliary frame 220. At least one guide groove 240 is provided in each of four edges of each of the display device mounting portions A1, A2, A3, and A4.

A guide protrusion 152 provided in the back cover housing 150 of each of the first to fourth display devices 110a, 110b, 110c, and 110d is forcibly inserted into the guide groove 240 so that a position of each of the first to fourth display devices 110a, 110b, 110c, and 110d is fixed onto the first cabinet 200a.

In this case, the main frame 210 may further include protruding ends 250 thereinside. The first to fourth display devices 110a, 110b, 110c, and 110d, of which rear edges are supported by and fixed to the display device mounting portions A1, A2, A3, and A4, may be more stably supported by the protruding ends 250.

In addition, a ball housing 260 made of a ceramic material and passing through the main frame 210 is provided on the main frame 210 of the first cabinet 200a. A plurality of protrusion grooves 261 are provided in an inside of the ball housing 260. At least two ball housings 260 are provided in a longitudinal direction of the main frame 210 of the first cabinet 200a.

Therefore, as shown in FIG. 3B, the second cabinet 200b is positioned on one side of the first cabinet 200a so that the ball housing 260 of the second cabinet 200b corresponds to the ball housing 260 of the first cabinet 200a, and then a locker portion 410 of the cam lever locker 400 is assembled and fastened to the ball housing 260 of each of the first and second cabinets 200a and 200b so as to pass through the ball housing 260 of each of the first and second cabinets 200a and 200b, and thus the first and second cabinets 200a and 200b are assembled and fastened to each other and are integrally modularized.

Here, the cam lever locker 400 allows a module protrusion 420 which is provided to protrude outward from the locker portion 410 to be forcibly inserted into the protrusion grooves 261 provided inside the ball housing 260, and thus the first and second cabinets 200a and 200b are assembled and fastened to each other.

In this case, a handle portion 430 may be provided at another side of the locker portion 410 of the cam lever locker 400 for ease of operation.

Therefore, the first to fourth display devices 110a, 110b, 110c, and 110d each including the display panel 120, the back cover 140, and the back cover housing 150 are respectively attached to and supported by the display device mounting portions A1, A2, A3, and A4 above the main frame 210 and the auxiliary frame 220 of the first cabinet 200a to form the first unit U1, as shown in FIG. 4A, and the second unit U2 including the second cabinet 200b on which the fifth to eighth display devices 110e, 110f, 110g, and 110h are attached and supported is positioned on one side of the first unit U1.

In this case, the first cabinet 200a and the second cabinet 200b are assembled and fastened to each other using the cam lever locker 400 so that the first unit U1 and the second unit U2 constitute one multi-panel display device 100, as shown in FIG. 4B.

As described above, the plurality of display devices 110a, 110b, 110c, 110d, 110e, 110f, 110g, and 110h are defined as units U1 and U2 using the cabinets 200a and 200b and the plurality of units U1 and U2 constitute the multi-panel display device 100, and thus efficiency of a process for implementing the multi-panel display device 100 is improved.

That is, unlike a structure in which the plurality of display devices 110a, 110b, 110c, 110d, 110e, 110f, 110g, and 110h are connected to each other one by one, the plurality of display devices 110a, 110b, 110c, 110d, 110e, 110f, 110g, and 110h are divided into the first to fourth display devices 110a, 110b, 110c, and 110d and the fifth to eighth display devices 110e, 110f, 110g, and 110h to define the first and second units U1 and U2, and the multi-panel display device 100 is implemented by allowing only the first and second units U1 and U2 to be connected to each other, and thus a process time for implementing the multi-panel display device 100 can be shortened and the efficiency of the process can be improved.

Particularly, the multi-panel display device 100 according to the aspect of the present disclosure further includes a fine adjustment device 500 (of FIG. 5A) which may finely adjust positions of the display panel 120 and the back cover 140 at the rear surfaces of the cabinets 200a and 200b after the plurality of display devices 110a, 110b, 110c, 110d, 110e, 110f, 110g, and 110h are attached and positioned to the cabinets 200a and 200b.

Accordingly, in the multi-panel display device 100 according to the aspect of the present disclosure, the plurality of display devices 110a, 110b, 110c, 110d, 110e, 110f, 110g, and 110h may be accurately arranged at predetermined positions in a process of arranging the plurality of display devices 110a, 110b, 110c, 110d, 110e, 110f, 110g, and 110h in a tiled form.

Further, intervals between the neighboring display devices 110a, 110b, 110c, 110d, 110e, 110f, 110g, and 110h may be finely adjusted so that boundary regions between the neighboring display devices 110a, 110b, 110c, 110d, 110e, 110f, 110g, and 110h may be prevented from being visible. Accordingly, the continuity of an image can be prevented from being degraded.

Further, occurrence of damage due to collision of the neighboring display devices 110a, 110b, 110c, 110d, 110e, 110f, 110g, and 110h can also be prevented.

Figure 5A:
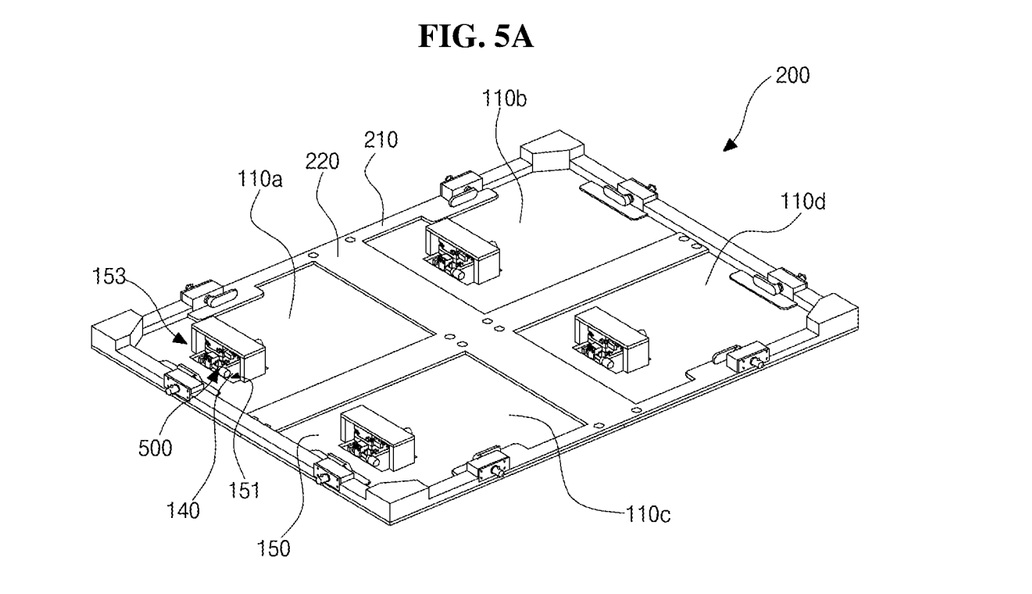
FIG. 5A is a perspective view schematically showing a rear surface of a multi-panel display device according to an aspect of the present disclosure.
Figure 5B:
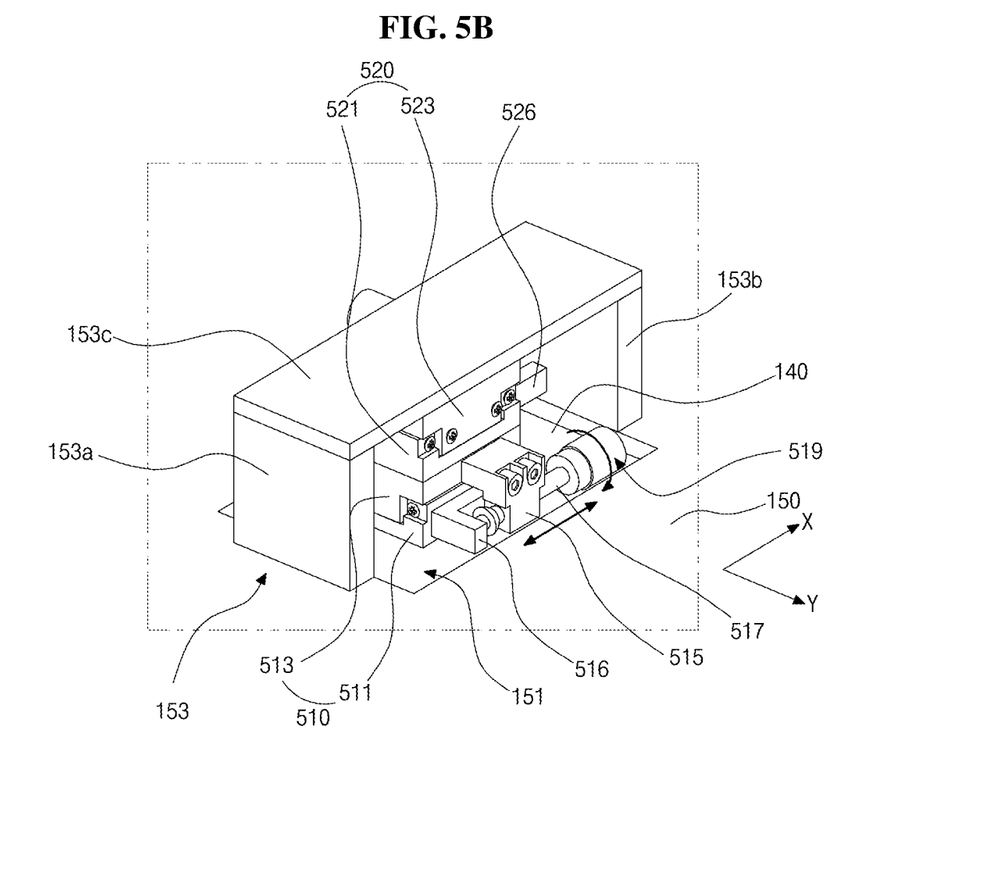
FIGS. 5B and 5C are perspective views schematically showing a position of a display device which is finely adjusted by a fine adjustment device of FIG. 5A.
Figure 5C:
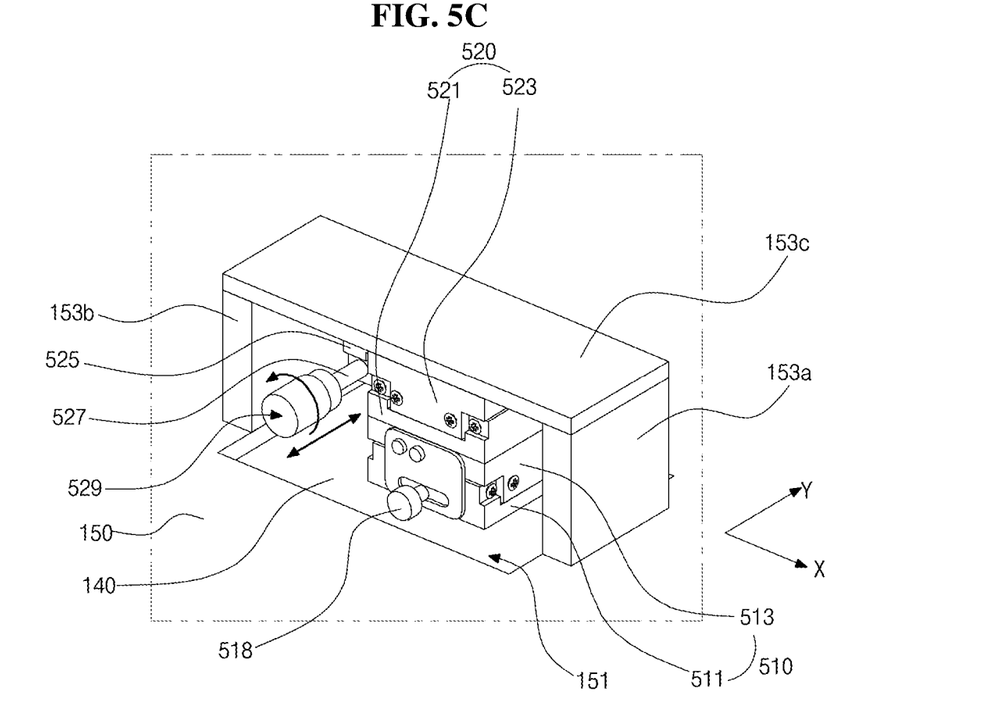

FIG. 5A is a perspective view schematically showing a rear surface of a multi-panel display device according to an aspect of the present disclosure, and FIGS. 5B and 5C are perspective views schematically showing a position of a display device which is finely adjusted by a fine adjustment device of FIG. 5A.

Figure 6A:
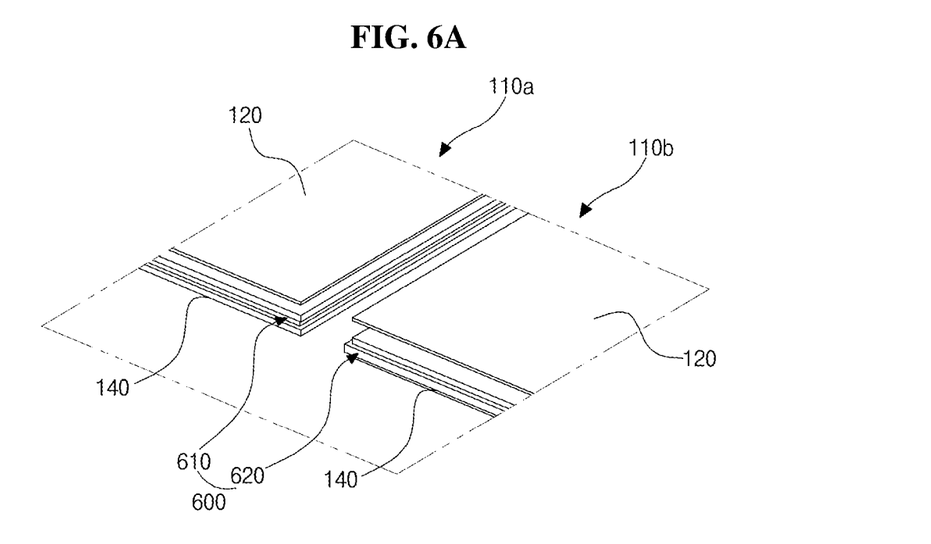
FIG. 6A is a perspective view schematically showing a guide portion provided on a side surface of a back cover of a display device according to an aspect of the present disclosure.
Figure 6B:
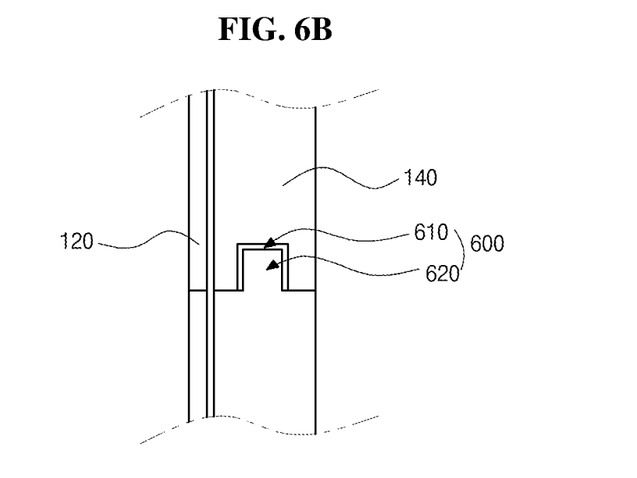
FIG. 6B is a cross-sectional view of FIG. 6A.

FIG. 6A is a perspective view schematically showing a guide portion provided on a side surface of a back cover of a display device, and FIG. 6B is a cross-sectional view of FIG. 6A.

As shown in FIG. 5A, rear surfaces of display devices 110a, 110b, 110c, and 110d, which are respectively mounted and attached to the display device mounting portions A1, A2, A3, and A4 (of FIG. 3A) on a main frame 210 and an auxiliary frame 220 of a cabinet 200, are exposed between the main frame 210 and the auxiliary frame 220 of the cabinet 200.

In this case, a fine adjustment device 500 is positioned on the rear surface of each of the display devices 110a, 110b, 110c, and 110d, and the fine adjustment device 500 is positioned between a back cover 140 and a back cover housing 150 of each of the display devices 110a, 110b, 110c, and 110d. To this end, an adjustment device hole 151 for exposing a portion of a rear surface of the back cover 140 is provided in the back cover housing 150 and a fixing member 153 for protecting and supporting the fine adjustment device 500 is provided around the adjustment device hole 151.

The fixing member 153 includes first and second fixing ends 153a and 153b, which protrude perpendicularly from a rear surface of the back cover housing 150 and face each other with the adjustment device hole 151 interposed therebetween, and a third fixing end 153c, which connects the first and second fixing ends 153a and 153b and covers the adjustment device hole 151.

In this case, the third fixing end 153c is formed to have an area smaller than an area of the adjustment device hole 151 so as not to fully cover the adjustment device hole 151 so that the fine adjustment device 500 exposed to the adjustment device hole 151 is exposed to the outside of the fixing member 153.

The operator finely and manually adjusts the fine adjustment device 500 exposed to the outside.

Here, the fine adjustment device 500 will be described in more detail with reference to FIGS. 5B and 5C. The fine adjustment device 500 is divided and defined into a first block unit 510 and a second block unit 520, and the first and second block units 510 and 520 are positioned to overlap each other.

The first block unit 510 is divided into first and second blocks 511 and 513, and the second block unit 520 is divided into third and fourth blocks 521 and 523. The first block 511 and the second block 513 are assembled to move in an X-axis direction defined in the drawing and the third block 521, and the fourth block 523 are assembled to move in a Y-axis direction defined in the drawing.

The first block 511 is assembled and fixed to the rear surface of the back cover 140 and the fourth block 523 is assembled and fixed to the fixing member 153 of the back cover housing 150. Further, the first block 511 and the third block 521 are assembled and connected to each other and the second block 513 and the fourth block 523 are also assembled and connected to each other.

In this case, first and second lever fixing ends 515 and 525 are provided to protrude from the second block 513 and the fourth block 523, respectively. First and second manual levers 519 and 529 including first and second rotation shafts 517 and 527 having screw threads (not shown) formed on outer circumferential surfaces thereof are provided to pass through the first and second lever fixing ends 515 and 525, respectively.

In this case, screw threads (not shown) engaging with the screw threads (not shown) formed on the outer circumferential surfaces of the first and second rotation shafts 517 and 527 are provided inside the first and second lever fixing ends 515 and 525.

As the first and second rotation shafts 517 and 527 which are coupled to and pass through the first and second lever fixing ends 515 and 525 are rotated, the first and second manual levers 519 and 529 are moved forward or backward along the screw threads (not shown) of the first and second rotation shafts 517 and 527, respectively, so that ends of the first and second rotation shafts 517 and 527 of the first and second manual levers 519 and 529 are moved away from or close to the first and second lever fixing ends 515 and 525.

In this case, first and second locking jaws 516 and 526, which are fixedly in contact with the ends of the first and second rotation shafts 517 and 527 of the first and second manual levers 519 and 529, are provided to protrude from the first block 511 and the third block 521 so that a force is respectively applied to the first block 511 and the third block 521 according to the forward or backward movement of the first and second manual levers 519 and 529.

That is, when the first manual lever 519 is rotated, the end of the first rotation shaft 517 of the first manual lever 519 is moved away from or closer to the first lever fixing end 515 provided on the second block 513 by the rotation of the first manual lever 519. Accordingly, a constant force is applied to the first locking jaw 516 which is fixedly in contact with the first rotation shaft 517 of the first manual lever 519 so that the first block 511 is moved in the X-axis direction defined in the drawing.

In this case, the first block 511 is assembled and fixed to the back cover 140 of each of the display devices 110a, 110b, 110c, and 110d so that a constant force is also applied to the back cover 140 of each of the display devices 110a, 110b, 110c, and 110d. In this case, the back cover 140 and the back cover housing 150 are fixed to each other by a rubber magnet (not shown) and thus the back cover 140 is caused to move separately from the back cover housing 150 due to the force applied by the first block 511.

That is, the back cover 140 and the display panel 120 of each of the display devices 110a, 110b, 110c, and 110d are also moved in the X-axis direction defined in the drawing.

Further, when the second manual lever 529 is rotated, the end of the second rotation shaft 527 of the second manual lever 529 is moved away from or closer to the second lever fixing end 525 by the rotation of the second manual lever 529. Accordingly, a constant force is applied to the second locking jaw 526 which is fixedly in contact with the second rotation shaft 527 of the second manual lever 529 so that the third block 521 is moved in the Y-axis direction defined in the drawing.

In this case, the third block 521 is also assembled and fixed to the back cover 140 of each of the display devices 110a, 110b, 110c, and 110d so that the back cover 140 and the display panel 120 of each of the display devices 110a, 110b, 110c, and 110d are also moved in the Y-axis direction defined in the drawing.

Here, the fine adjustment of the positions of the display devices 110a, 110b, 110c, and 110d according to the aspect of the present disclosure using the fine adjustment device 500 is performed by screw loosening and fastening between the screw threads (not shown) which are provided on the outer circumferential surfaces of the rotation shafts 517 and 527 of the manual levers 519 and 529 and the lever fixing ends 515 and 525 by the rotation of the manual levers 519 and 529 of the fine adjustment device 500 by the operator, and thus the positions of the display devices 110a, 110b, 110c, and 110d may be very finely adjusted.

Therefore, the display devices 110a, 110b, 110c, and 110d may be positioned at predetermined positions on the cabinet 200. Accordingly, the plurality of display devices 110a, 110b, 110c, and 110d can be accurately arranged.

Further, since intervals between the neighboring display devices 110a, 110b, 110c, and 110d may be finely adjusted, boundary regions between the neighboring display devices 110a, 110b, 110c, and 110d may be prevented from being visible, and thus the continuity of the image can be prevented from being degraded.

Further, occurrence of damage due to collision of the neighboring display devices 110a, 110b, 110c, and 110d can also be prevented.

Here, a first fixing lever 518 and a second fixing lever (not shown) are further provided on the first block 511 and the third block 521. The first fixing lever 518 and the second fixing lever (not shown) are respectively positioned at opposite sides of the first and second locking jaws 516 and 526 of the first and third blocks 511 and 521 and are respectively assembled and fixed to the first and second locking jaws 516 and 526.

Therefore, the first fixing lever 518 fixes a position of the first locking jaw 516 and the second fixing lever (not shown) fixes a position of the second locking jaw 526.

That is, when the fine adjustment of the positions of the display devices 110a, 110b, 110c, and 110d in the X-axis direction defined in the drawing is completed using the first block unit 510, a constant external force is applied to the first locking jaw 516 by the forward or backward movement of the first fixing lever 518 in the longitudinal direction by rotating the first fixing lever 518, and thus the position of the first locking jaw 516 is fixed.

As the position of the first locking jaw 516 is fixed by the first fixing lever 518, the position of the first block 511 is also fixed so that the movement of the display devices 110a, 110b, 110c, and 110d in the X-axis direction defined in the drawing is prevented.

Further, when the fine adjustment of the positions of the display devices 110a, 110b, 110c, and 110d in the Y-axis direction defined in the drawing is completed using the second block unit 520, a constant external force is applied to the second locking jaw 526 by the forward or backward movement of the second fixing lever (not shown) in the longitudinal direction by rotating the second fixing lever (not shown), and thus the position of the second locking jaw 526 is fixed. Accordingly, the movement of the display devices 110a, 110b, 110c, and 110d in the Y-axis direction defined in the drawing is prevented.

In this case, as shown in FIGS. 6A and 6B, a linear guide portion 600 is further provided on a side surface of the back cover 140 of each of the display devices 110a and 110b. The linear guide portion 600 includes a linear guide groove 610 formed on the side surface of the back cover 140 to be concave in the longitudinal direction, and a linear guide protrusion 620 formed on the side surface of the back cover 140 to be convex in the longitudinal direction.

That is, the linear guide groove 610 is provided in the side surface of the back cover 140 of the first display device 110a, and the linear guide protrusion 620 corresponding to the linear guide groove 610 is provided on the side surface of the back cover 140 of the neighboring second display device 110b adjacent to the first display device 110a.

The linear guide groove 610 and the linear guide protrusion 620 are forcibly inserted into each other.

Therefore, in a process of finely adjusting the positions of the back cover 140 and the display panel 120 of the display devices 110a and 110b on the cabinet 200 using the fine adjustment device 500 positioned on the rear surface of each of the display devices 110a and 110b, the positions of the first and second display devices 110a and 110b, which are positioned adjacent to each other, are guided by the linear guide groove 610 and the linear guide protrusion 620, which are provided on the side surface of the back cover 140 of each of the first and second display devices 110a and 110b.

Therefore, the display devices 110a and 110b can be more accurately arranged at predetermined positions.

Here, the linear guide groove 610 may be provided on each of four side edges of the back cover 140 of each of the first and second display devices 110a and 110b. The linear guide groove 610 and the linear guide protrusion 620 may exist in a mixed manner on the four side edges of the back cover 140.

In this case, the linear guide groove 610 and the linear guide protrusion 620 may have N polarity and S polarity, respectively, so that the linear guide groove 610 and the linear guide protrusion 620 may be attached to each other by a magnetic force. Therefore, the positions of the first and second display devices 110a and 110b which are positioned adjacent to each other can be more accurately guided.

As described above, in the multi-panel display device 100 (of FIG. 4B) according to the aspect of the present disclosure, the plurality of display devices 110a, 110b, 110c, and 110d are defined as one unit U1 or U2 (of FIG. 4A) using the cabinet 200 and a plurality of units U1 and U2 (of FIG. 4A) constitute the multi-panel display device 100 (of FIG. 4B), and thus efficiency of the process for implementing the multi-panel display device 100 (of FIG. 4B) is improved.

Particularly, the multi-panel display device 100 (of FIG. 4B) according to the aspect of the present disclosure further includes the fine adjustment device 500 which can finely adjust positions of the display panel 120 and the back cover 140 at the rear surface of the cabinet after the plurality of display devices 110a, 110b, 110c, and 110d are attached and positioned to the cabinet 200, and thus the plurality of display devices 110a, 110b, 110c, and 110d can be accurately arranged at predetermined positions.

Therefore, the intervals between the neighboring display devices 110a, 110b, 110c, and 110d can be finely adjusted, and thus boundary regions between the neighboring display devices 110a, 110b, 110c, and 110d can be prevented from being visible. Accordingly, the continuity of the image can be prevented from being degraded. Further, occurrence of damage due to collision of the neighboring display devices 110a, 110b, 110c, and 110d can also be prevented.

As described above, according to the present disclosure, a plurality of display devices are defined as one unit using one cabinet, and a plurality of units form one multi-panel display device, and thus efficiency of a process for implementing the multi-panel display device can be improved.

Particularly, the multi-panel display device according to the aspect of the present disclosure further includes a fine adjustment device, which can finely adjust positions of a display panel and a back cover on a rear surface of cabinet after the plurality of display devices are attached and positioned onto the cabinet, and thus the plurality of display devices can be accurately arranged at predetermined positions. Therefore, an interval between neighboring display devices can be finely adjusted, and thus a boundary region between the neighboring display devices can be prevented from being visible.

Further, occurrence of damage due to collision of the neighboring display devices can also be prevented.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A multi-panel display device comprising:
   a first display device and a second display device each including a display panel, a back cover configured to cover a rear surface of the display panel, and a back cover housing configured to cover a rear surface of the back cover;
   a first cabinet supporting and attaching the first and second display devices; and
   a fine adjustment device positioned on a rear surface of each of the first and second display devices and exposed to a rear surface of the first cabinet,
   wherein the fine adjustment device is connected to the back cover of each of the first and second display devices and exposed to an outside through an adjustment device hole provided in the back cover housing, and positions of the back cover and the display panel are finely adjusted by the fine adjustment device,
   wherein the fine adjustment device includes a first block unit configured to finely adjust the first and second display devices in an X-axis direction and a second block unit configured to finely adjust the first and second display devices in a Y-axis direction, and
   wherein the first block unit is divided and defined as a first block and a second block assembled to move in the X-axis direction, and the second block unit is divided and defined as a third block and a fourth block assembled to move in the Y-axis direction.

2. The multi-panel display device of claim 1, wherein the first cabinet includes a main frame having a rectangular frame shape and an auxiliary frame connecting four inward edges of the main frame.

3. The multi-panel display device of claim 2, wherein the main frame and the auxiliary frame include a plurality of magnet units, wherein the first and second display devices are attached and fixed to the first cabinet by supporting a rear edge of the back cover housing of each of the first and second display devices.

4. The multi-panel display device of claim 2, wherein each of the main frame and the auxiliary frame includes a guide groove and a guide protrusion protruded from a rear surface of the back cover housing forcibly inserted into the guide groove.

5. The multi-panel display device of claim 1, further comprising:
   a first ball housing passing through the main frame and provided on the first cabinet;
   a second cabinet including a second ball housing and provided at one side of the first cabinet; and
   a cam lever locker having a locker portion passing through the first and second ball housings, and the first and second cabinets are assembled and fastened to each other.

6. The multi-panel display device of claim 5, further comprising a module protrusion forcibly inserted into a protrusion groove which is provided in each of the first and second ball housings is provided at the locker portion.

7. The multi-panel display device of claim 1,
   wherein the first block is fixedly connected to the back cover, the fourth block is fixedly connected to the back cover housing, the first block and the third block are fixedly connected to each other, and the second block and the fourth block are fixedly connected to each other.

8. The multi-panel display device of claim 7, wherein the back cover housing includes a first fixing end and a second fixing end configured to protrude perpendicularly from a rear surface of the back cover housing and face each other with the adjustment device hole interposed therebetween, and a third fixing end configured to connect the first and second fixing ends and cover a portion of the adjustment device hole, and wherein the third fixing end is fixedly connected to the fourth block.

9. The multi-panel display device of claim 7, further comprising:
   a first lever fixing end protruding from the second block;
   a first manual lever having a first rotation shaft in which screw threads are provided to pass through the first lever fixing end;
   a first locking jaw fixedly in contact with an end of the first rotation shaft provided in the first block;
   a second lever fixing end protruding from the fourth block;
   a second manual lever having a second rotation shaft in which screw threads are provided to pass through the second lever fixing end; and
   a second locking jaw fixedly in contact with an end of the second rotation shaft provided in the third block.

10. The multi-panel display device of claim 9, wherein each of the first block and the third block includes a first fixing lever and a second fixing lever, which are respectively assembled and fixed to the first locking jaw and the second locking jaw.

11. A multi-panel display device comprising:
a first display device and a second display device each including a display panel, a back cover configured to cover a rear surface of the display panel, and a back cover housing configured to cover a rear surface of the back cover;
a first cabinet supporting and attaching the first and second display devices; and
a fine adjustment device positioned on a rear surface of each of the first and second display devices and exposed to a rear surface of the first cabinet,
wherein the fine adjustment device is connected to the back cover of each of the first and second display devices and exposed to an outside through an adjustment device hole provided in the back cover housing, and positions of the back cover and the display panel are finely adjusted by the fine adjustment device,
wherein a side surface of the back cover of the first display device includes a linear guide groove and a side surface of the back cover of the second display device includes a linear guide protrusion forcibly inserted into the guide groove.

12. The multi-panel display device of claim 11, wherein the linear guide groove and the linear guide protrusion have an N polarity and an S polarity, respectively.

13. A multi-panel display device comprising:
first and second display devices each including a display panel, a back cover covering a rear surface of the display panel and including a linear guide portion on a side surface thereof, and a back cover housing covering a rear surface of the back cover; and
a first cabinet supporting and attaching the first and second display devices,
wherein the linear guide portion includes a linear guide groove on a whole of a side surface of the back cover in a longitudinal direction and a linear guide protrusion on the whole of the side surface of the back cover in the longitudinal direction, and
wherein the linear guide groove of one of the first and second display devices and the linear guide protrusion of the other of the first and second display devices are forcibly inserted into each other.

14. The multi-panel display device of claim 13, wherein the one of the linear guide groove and the linear guide protrusion has an N polarity and the other of the linear guide groove and the linear guide protrusion has an S polarity.

15. The multi-panel display device of claim 13, further comprising a fine adjustment device connected to the back cover to finely adjust positions of the back cover and the display panel.

16. The multi-panel display device of claim 15, wherein positions of the first and second display devices are guided by the linear guide groove and the linear guide protrusion and the positions of the back cover and the display panel is finely adjusted by the fine adjustment device.

17. The multi-panel display device of claim 16, wherein the back cover and the display panel are attached to each other by an adhesive, and the back cover and the back cover housing are fixed to each other by a rubber magnet.

18. The multi-panel display device of claim 13, wherein the first and second display devices are attached to and fixed to the first cabinet by a plurality of magnet units.

19. The multi-panel display device of claim 13, wherein the first cabinet includes a first ball housing, and a second cabinet including a second ball housing is disposed at one side of the first cabinet, and
wherein the first and second cabinets are assembled and fastened to each other by a cam lever locker passing through the first and second ball housings.

* * * * *